United States Patent
Dufour

[19]

[11] Patent Number: 6,111,470
[45] Date of Patent: Aug. 29, 2000

[54] PHASE-LOCKED LOOP CIRCUIT WITH CHARGE PUMP NOISE CANCELLATION

[75] Inventor: Yves Dufour, Sunnyvale, Calif.

[73] Assignee: Philips Electronics North America Corporation, New York, N.Y.

[21] Appl. No.: 09/169,389

[22] Filed: Oct. 9, 1998

[51] Int. Cl.[7] .................................................. H03L 7/089
[52] U.S. Cl. .......................... 331/17; 331/1 A; 331/25; 327/536; 327/156; 327/157
[58] Field of Search ............................... 331/17, 25, 1 A; 327/536, 156, 157

[56] References Cited

U.S. PATENT DOCUMENTS

| | | | |
|---|---|---|---|
| 5,465,061 | 11/1995 | DuFour | 327/112 |
| 5,485,125 | 1/1996 | DuFour | 331/17 |
| 5,703,511 | 12/1997 | Okamoto | 327/157 |

FOREIGN PATENT DOCUMENTS

0718978A1  6/1996  European Pat. Off. ........ H03L 7/089

OTHER PUBLICATIONS

"A 300–MHZ BiCMOS Serial Data Transceiver", IEEE Journal SC29, No. 3, Mar. 1994, p. 185–192.

*Primary Examiner*—Arnold Kinkead
*Assistant Examiner*—Kimberly E Glenn
*Attorney, Agent, or Firm*—Brian J. Wieghaus

[57] ABSTRACT

The switching time of a phase-locked loop (PLL) circuit can be reduced by increasing circuit bandwidth. A charge pump system is commonly used in the PLL circuitry to drive the voltage control oscillator (VCO). The increase in bandwidth intensifies the noise that is contributed by the charge pump system. To reduce charge pump noise, a chopper stabilizer circuit modulates the noise to a sufficiently high frequency so that a low-pass filter may filter out the modulated noise.

25 Claims, 7 Drawing Sheets

PHASE-LOCKED LOOP CIRCUIT WITH CHARGE PUMP NOISE CANCELLATION

TECHNICAL FIELD

The present invention relates to a phase-lock loop circuit, more particularly to methods and systems for charge pump noise cancellation using chopper stabilization.

BACKGROUND ART

Phase-locked loop (PLL) circuits are widely implemented in many applications for "locking" an oscillator in phase with a reference signal. These circuits are frequently employed, for example, in digital communication systems for generating a local clock signal that is phase aligned with an incoming reference signal. The phase aligned local clock signal facilitates the receipt and processing of synchronous data sent by a transmitter in the communication system. PLL circuits also have use in numerous other applications (e.g., FM receivers, portable cellular phones, spread spectrum receivers, etc.).

Figure 1:
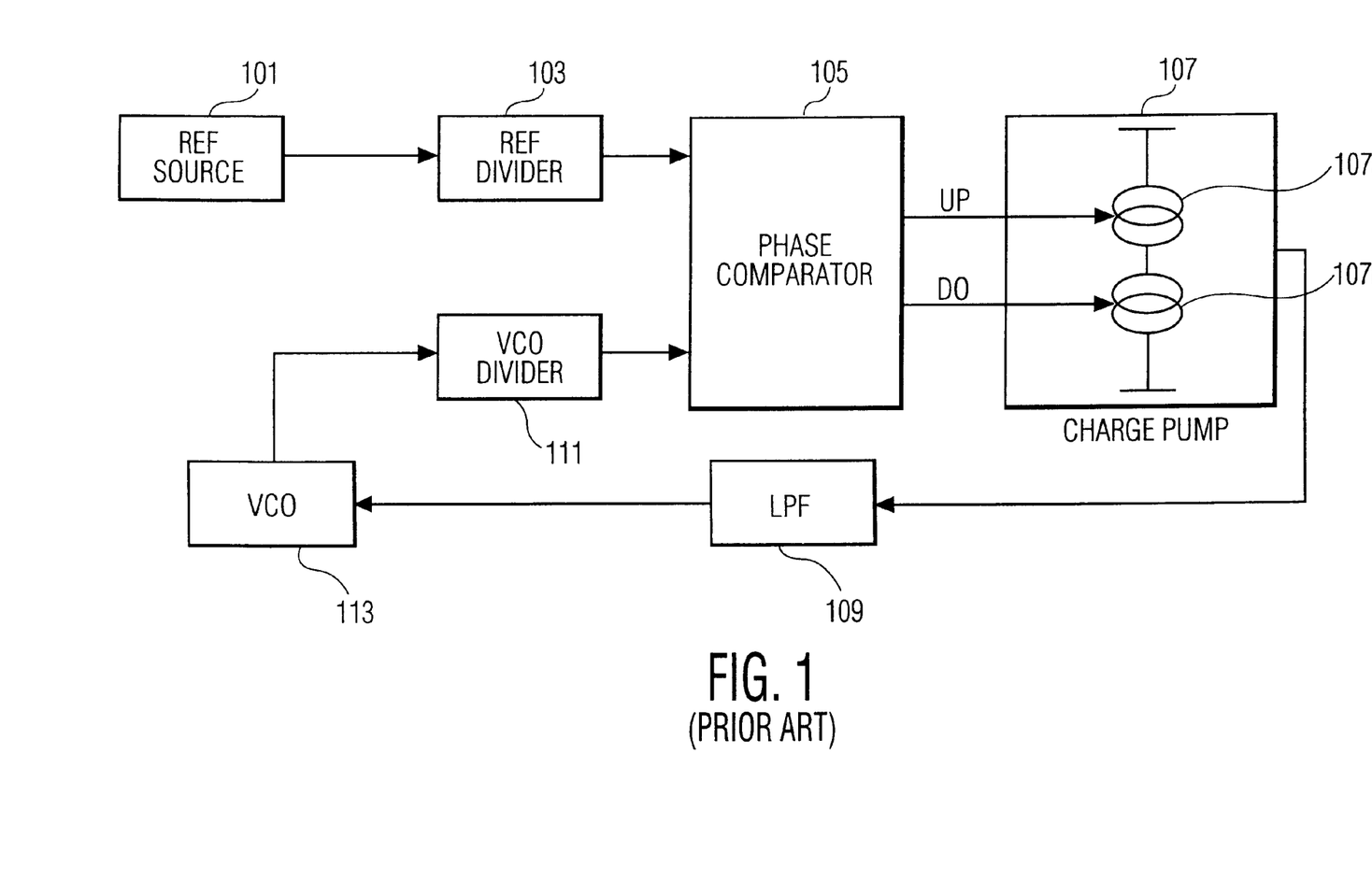
FIG. 1 is a diagram of a conventional phase-locked loop circuit used in a frequency synthesizer.

FIG. 1 illustrates a conventional PLL circuit implemented in an integrated circuit for frequency synthesis. Frequency synthesis involves producing frequencies that are multiples of a reference frequency. The reference source 101, which is typically a crystal oscillator, outputs a reference signal to a reference divider 103, which then supplies a divided reference signal to a phase comparator 105. A voltage controlled oscillator (VCO) 113 also provides a VCO signal to a VCO divider 111, which outputs a divided VCO signal. The phase comparator 105 detects the phase difference between the divided reference signal and the divided VCO signal and outputs a corresponding phase error signal. The phase error signal is outputted to a charge pump 107, which supplies a current that is proportional to the phase error. The current is then filtered via a low-pass filter (LPF) 109 and applied to the control input of the VCO 113 to produce an output signal that tracks the phase of the divided reference signal. The process continues until a zero phase error is attained, whereby the two frequencies are properly aligned.

Channel switching time, which is a measure of performance of a PLL circuit, represents the ability of the PLL circuit to switch from a given channel (VCO frequency) to another channel. To achieve a shorter switching time, channel bandwidth can be increased within the general frequency spacing, but results in significant noise contribution from the charge pumps. In the past, switching time was not a primary concern, allowing use of narrow bandwidths, which permits the PLL circuit to be tolerant of "noisy" charge pumps. However, switching time is now of greater concern due to requirements for faster switching. Because channel bandwidth is increased, noise within the charge pump is more pronounced, having greater detrimental impact on the PLL circuit performance.

Charge pumps, in general, introduce low frequency phase noise into the PLL circuit. An exemplary charge pump 107 is implemented as a differential charge pump, as shown in FIG. 1, in which two current sources 107a, 107b are required for linear operation. A typical differential charge pump is disclosed in European Patent No. EP 0 718 978 A1 to Bruccoleri et al. According to FIG. 1, one current source 107a ("Ppump") charges a storage capacitor (not shown); while the other current 107b ("Npump") discharges it. That is, the Ppump supplies current to the filter. During simultaneous operations, these current sources 107a, 107b produce substantial noise within the PLL circuit. Additionally, offset due to dynamic mismatch of the Npump and Ppump as well as direct current (DC) mismatch adversely affects the circuit by introducing more noise. DC mismatch arises because the charge pump is either OFF or switching most of the time; thus, the charge pump is ON only for a short duration. Charge pump noise appears in the VCO spectrum, potentially causing inaccurate locking or even non-locking by the VCO.

In an attempt to address these problems, a number of techniques have been developed to reduce charge pump noise; e.g., reduction of dynamic and static mismatch between the Ppump and Npump, reduction of the differential mode noise, suppression of the common mode noise, and augmentation of device switching speed. However, these techniques disadvantageously rely on the low frequency noise response of the output devices. Because noise is inherent in the components themselves, noise cancellation may not be possible. Further, some of the prior art methods are difficult to implement and are not applicable to various types of PLL circuitry (e.g., fractional-N frequency synthesizers).

DISCLOSURE OF THE INVENTION

There is a need for a PLL improvement that reduces offset and noise from its charge pump system. There is also a need for such an improvement that can be readily adapted to a variety of PLL circuits (i.e., both fractional and non-fractional circuits). Further, a need exists for an improvement of the type described, that can be readily implemented in PLL circuity.

In accordance with one aspect of the present invention, a phase-locked loop circuit comprises a charge pump for generating current to adjust phase alignment. A reference source generates a reference signal. A voltage controlled oscillator (VCO) generates a VCO signal. A phase comparator is coupled to the reference source and the VCO to detect a phase error between the reference signal and the VCO signal and to output an up-command signal and a down-command signal in response to the phase error. A charge pump generates current to adjust phase alignment. A chopper stabilizer circuit modulates noise that is introduced in part by the charge pump. A loop filter then filters the modulated noise. This arrangement provides charge pump noise cancellation, and advantageously permits the use of larger channel bandwidths.

Another aspect of the present invention provides a phase-locked loop circuit having a noise cancellation circuit comprising a phase comparator for determining a phase error between a first input signal and a second input signal and for outputting a first comparator output signal and a second comparator output signal. A charge pump receives the first comparator output signal and the second comparator output signal and outputs a first current that is proportional to the first comparator output signal and a second current that is proportional to the second comparator output signal. A chopper stabilizer circuit simultaneously swaps, according to a chopping frequency, the first input signal with the second input signal and the first current with the second current. Under this arrangement, noise contribution by the charge pump can be eliminated.

Yet another aspect of the invention provides a phase-locked loop circuit having a noise cancellation circuit comprising a phase comparator that determines a phase error between a first input signal and a second input signal and outputs a first comparator output signal and a second comparator output signal. A charge pump receives the first comparator output signal and the second comparator output signal and outputs a first current that is proportional to the first comparator output signal and a second current that is proportional to the second comparator output signal. A switching arrangement simultaneously swaps, according to a chopping frequency, the first comparator output signal with the second comparator output signal and the first current with the second current. This arrangement provides for elimination of device noise (particularly in the charge pump) within the PLL circuit.

Yet another aspect of the invention provides a method for cancelling noise in a PLL circuit of a type having a reference source, a voltage controlled oscillator (VCO), a phase comparator, a charge pump, and a loop filter. The method comprises modulating noise that is introduced in part by a charge pump, and filtering the modulated noise. Such a method advantageously enhances the noise performance of a PLL circuit.

Additional objects, advantages, and novel features of the present invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF DRAWINGS

Reference is made to the attached drawings, wherein elements having the same reference numeral designations represent like elements throughout and wherein.

DETAILED DESCRIPTION OF THE INVENTION

The invention applies noise cancellation derived from the operational amplifier art, and known as chopper stabilization, to a phase-locked loop circuit. A chopper stabilizer circuit effectively modulates a noise component within a symmetrical system, which is required to properly implement this noise cancellation technique. Chopper stabilization has not been used in the phase-lock loop field largely because of the symmetry constraint as well as a necessary increase in circuit complexity. For example, single-ended tri-statable type charge pumps, which exhibit desirable noise performance and thus used in one embodiment of the present invention, are asymmetric. The present invention advantageously uses a chopper stabilizer circuit that creates a symmetrical charge pump by implementing, in the preferred embodiment, a system of muxes in which one mux is integrated with the charge pump. According to this aspect of the invention, a chopper stabilizer circuit can be applied to a single-ended charge pump circuit (which is asymmetric because of its single output), such as the single-ended tristatable type, in such a way as to concurrently create the required symmetrical arrangement. Such an implementation is discussed in more detail later on.

Figure 2:
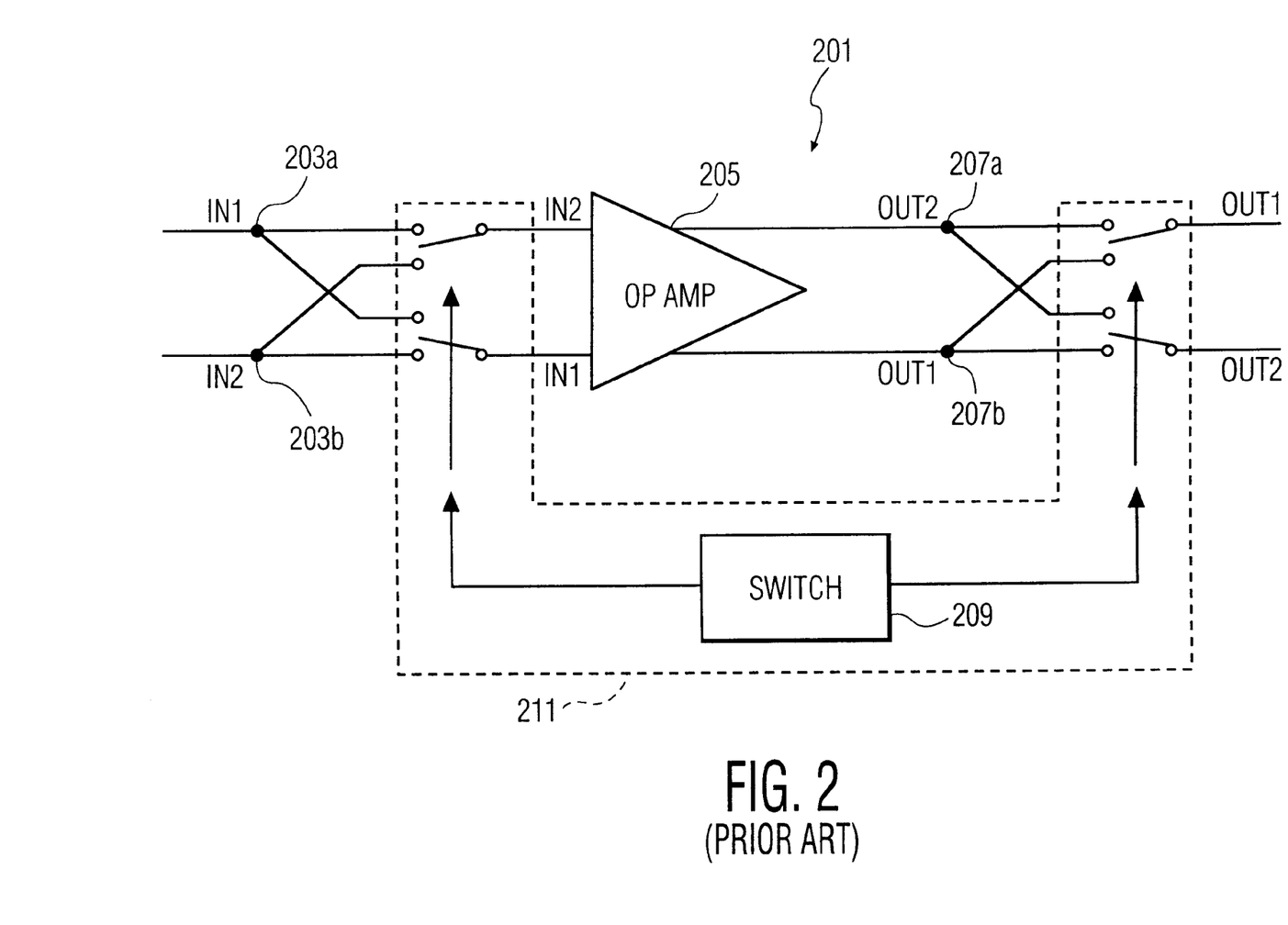
FIG. 2 is a diagram for explaining a chopper stabilizer circuit operation.

As shown in FIG. 2, a chopper stabilizer 211 is applied to an operational amplifier 205 whereby a switch 209 simultaneously swaps the inputs 203a, 203b and outputs 207a, 207b. The switching occurs at very high speed (e.g., in the order of us) according to a chopping frequency. Despite the swapping of the inputs 203a, 203b, the functionality of the amplifier 205, if symmetric, remains the same; and the offset contribution and other noise of the amplifier 205 are modulated to one-half the chopping frequency. The result is a low noise amplifier circuit 201 with little offset. This concept per this invention is adapted to components (charge pump) of a PLL circuit to gain similar noise reduction.

The principle of chopper stabilization can be applied, in accord with the invention, to individual components (e.g., charge pump) or to a subsystem of components (e.g., charge pump and phase comparator). The only constraint is that the individual components or the subsystem must be symmetrical; i.e., multiple inputs can be swapped and multiple outputs can be swapped without lost of functionality of the component or a subsystem thereof. The present invention contemplates the use of a symmetrical charge pump system described in U.S. Pat. No. 5,485,125 to Dufour, which in incorporated by reference in its entirety. Because the charge pump is the primary contributor of noise in the loop, the embodiments discussed below include the charge pump individually and as a part of a subsystem. For example, the chopper stabilizer circuit can be used to eliminate noise contribution from the following individual components: divider, phase comparator, or charge pump. In addition, a symmetrical subsystem may include a number of such components. A first embodiment (FIG. 3) involves the charge pump itself. A second embodiment (FIG. 5) contemplates a subsystem of components that includes a charge pump and a phase comparator. In a third embodiment (FIG. 6), the chopper stabilizer circuit is applied to a subsystem including a charge pump, a phase comparator, and dividers.

Figure 3:
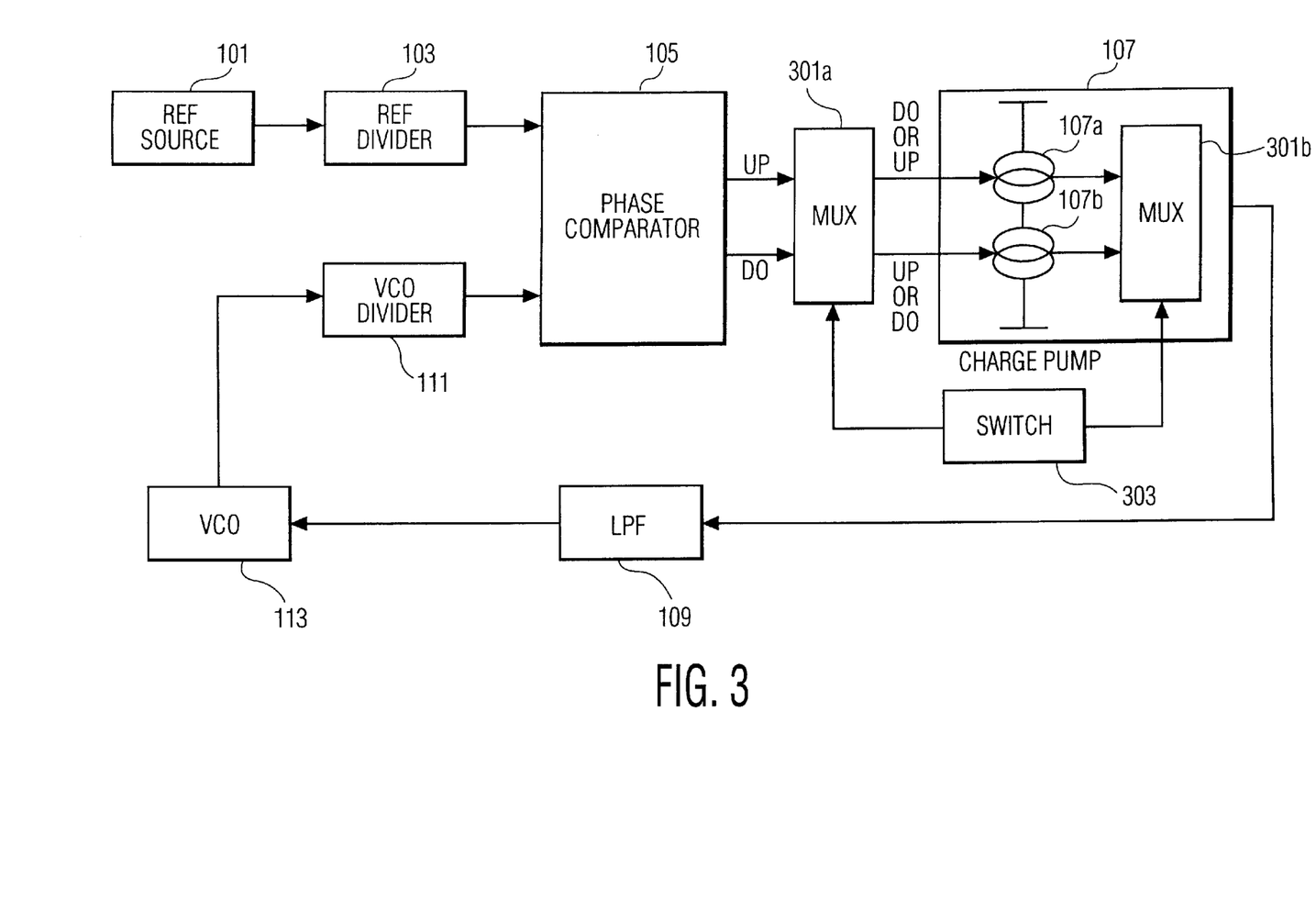
FIG. 3 is a diagram showing an embodiment of the invention, with chopper stabilization effected at the input and output of a charge pump.

One embodiment of the present invention is illustrated in FIG. 3. The chopper stabilizer circuit is implemented using two multiplexers (muxes) 301a, 301b that are controlled by a switch 303. One of the multiplexers 301a is coupled between a phase comparator 105 and a charge pump 107. When triggered by the switch 303, multiplexer 301a swaps the output signals of the phase comparator 105. The digital input signals of the charge pump 107, up-command (UP) and down-command (DO), are received from the phase comparator 105. In the operational mode depicted in FIG. 3, the UP signal may be directed to drive current source 107a or 107b, depending on the settings of mux 301b and the switch 303. Likewise, the DO signal may drive the top current source 107a or the bottom current source 107b. The second multiplexer 301b serves to re-orient the outputs modified by the reversal of inputs by the first multiplexer 301a. The rate of the swapping of input signals by multiplexer 301a and of output signals by multiplexer 301b is governed by switch 303. The swapping rate is referred to as the chopping frequency, to which the noise of the charge pump is approximately modulated. As discussed earlier, proper switching of the inputs and outputs dictates that the charge pump 107 be symmetrically designed.

In one implementation of the charge pump 107, Ppump 107a comprises a plurality of PNP bipolar transistors (not shown), whose bases can be connected to a base current generator (not shown) and whose collectors supply the current used to charge the LPF 109. Alternatively, the transistors that operate in parallel can be programmable. Npump 107b comprises a plurality of PNP bipolar transistors (not shown) in which all or a programmable number of them can be operated in parallel. The collector currents of these PNP transistors are applied to the inputs of current mirrors (not shown), which are formed by NPN bipolar transistors. All the transistors associated with both current sources 107a, 107b should be of identical construction and form matched pairs, ensuring symmetrical operation.

Figure 4:
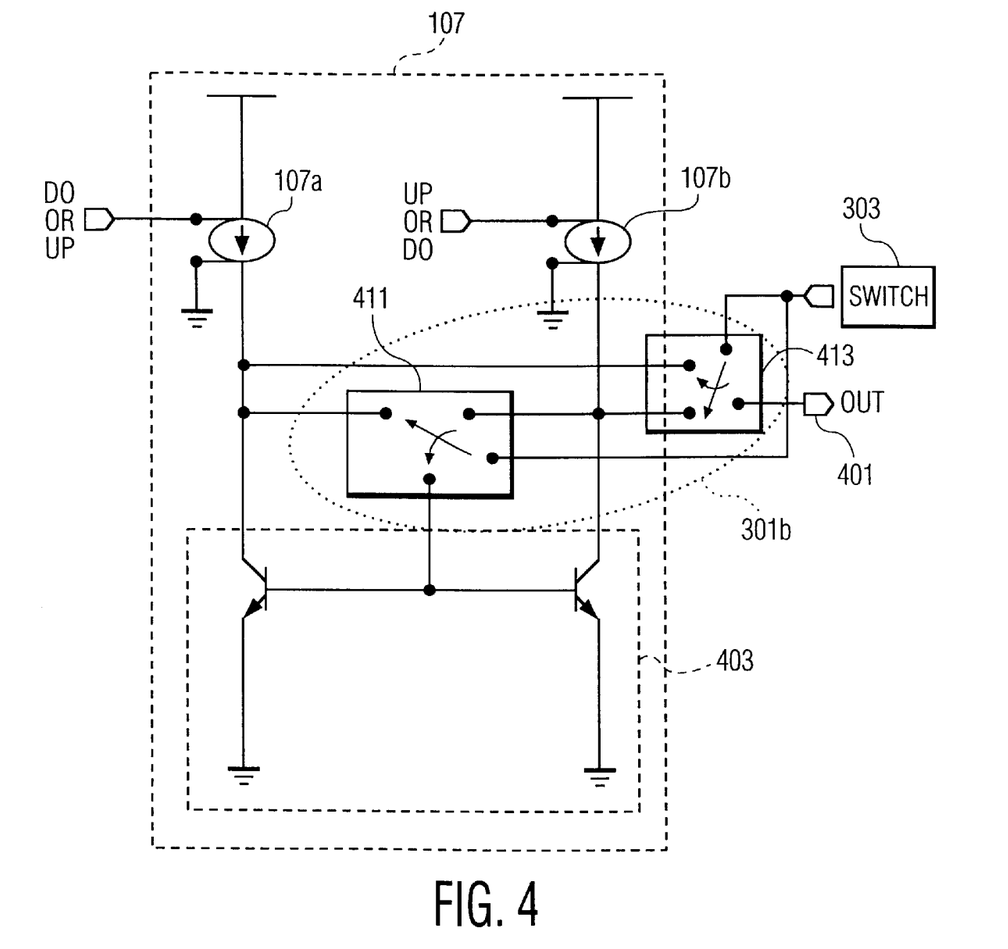
FIG. 4 is a diagram of a preferred embodiment of a multiplexer within the charge pump shown in FIG. 3.

FIG. 4 shows the preferred embodiment of multiplexer 301b, consistent with the configuration of FIG. 3. This implementation provides a symmetrical arrangement of a single-ended charge pump (which is asymmetric), thereby enabling the noise cancellation method to be used as contemplated by the present invention. The output 401, which is connected to the LPF 109 (FIG. 3) can be coupled to either one of the current sources 107a, 107b. The current mirror 403 is configured such that the output 401 is connected to one of the two current sources 107a, 107b. Switch 303, which is coupled to multiplexer 301b, is used to swap the inputs UP and DO. Multiplexer 301b is made of two analog switches 411, 413: one switch 413 coupled to the OUT pin (i.e., output port) 401 and the other 411 to the NPN base connection of current mirror 403. This arrangement imposes symmetry onto a "nearly" symmetrical circuit, such as the single-ended charge pump, which has only one output. Current sources 107a and 107b receive the UP and DO signals as inputs, depending on the manner in which output mux 301b is configured. For example, in one setting, 107a receives the DO signal and 107b receives the UP signal. Yet in another setting, 107a receives the UP signal, while 107b receives the DO signal. By using two switches 411, 413 in the manner shown, a single-ended charge pump (such as the one disclosed in U.S. Pat. No. 5,465,061) can be modified to form a symmetrical circuit. As modified, the charge pump 107 has two inputs and two possible outputs as controlled by switch 303 in conjunction with switch 411. The outputs of these current sources 107a, 107b are fed to the current mirror 403. Multiplexer 301b selects its output simultaneously with multiplexer 301a (not shown). Chopping (i.e., changing the switch position) can be toggled with every use of the pump 107. To effectively reduce the noise and the offset (i.e., dynamic mismatch of the pumps and of the mirror), a high enough chopping frequency should be used to alias the noise outside the desired frequency band.

According to one embodiment, a fractional-N type PLL can be employed to accommodate a high chopping frequency. Fractional-N PLL circuits are well known in the art; accordingly, the detailed mechanics of their operation are not discussed. In general, with fractional-N technique, performance of the PLL circuit is enhanced; for example, the comparison frequency can be made high (which provides better phase resolution and thus yields a faster switching time) while maintaining the same VCO frequency. With chopper stabilization, these advantageous properties are maintained while reduction in noise can be achieved.

Figure 5:
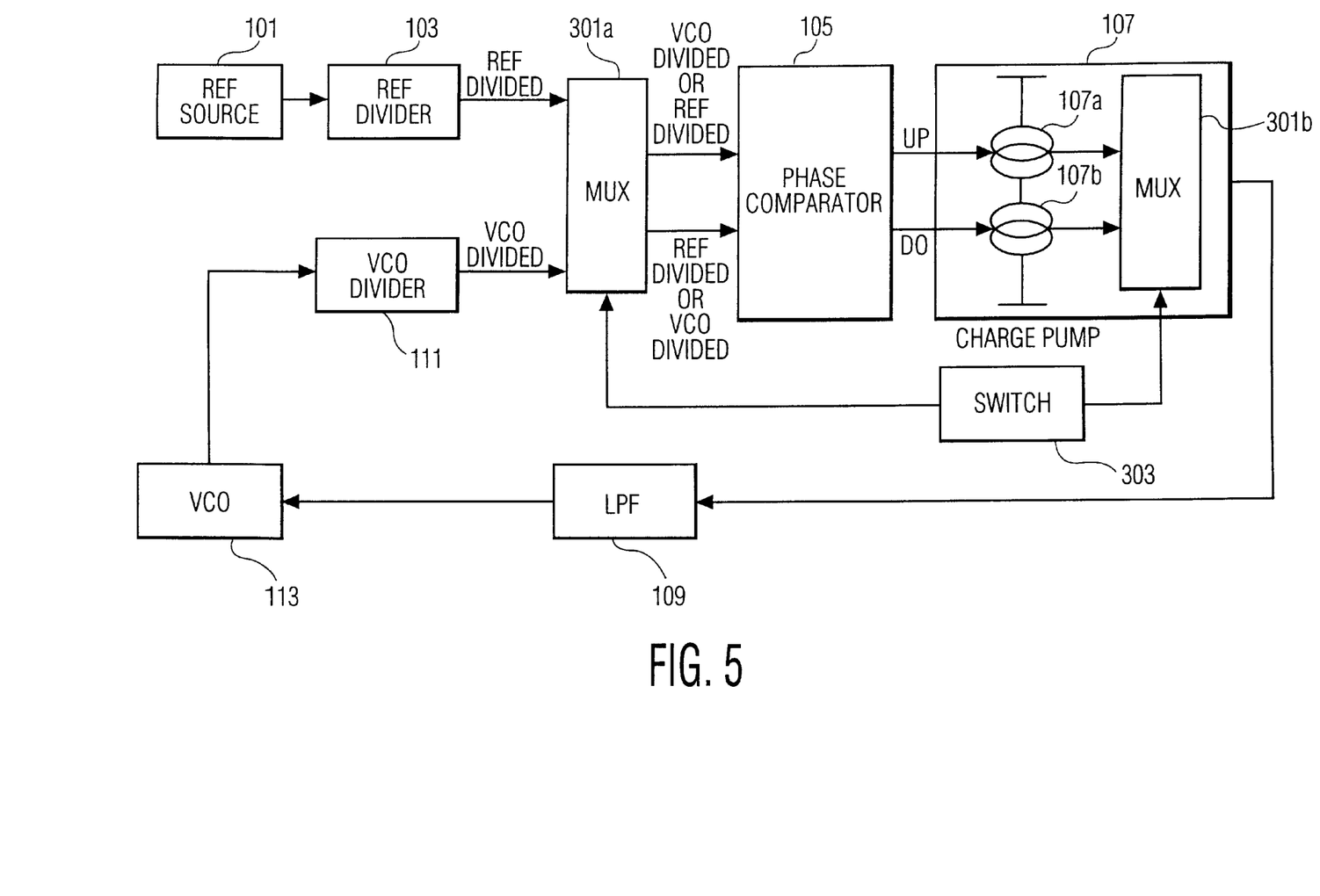
FIG. 5 is a diagram of an embodiment of the invention, with chopper stabilization performed at the input of a phase comparator and output of a charge pump.

In another embodiment of the present invention, one of two multiplexers can be situated between dividers 103, 111 and a phase comparator 105 as in FIG. 5. By expanding the chopper stabilizer circuitry to encompass the phase comparator 105, more of the noise of the PLL components can be eliminated, even beyond that emanating from the charge pump 107. In this embodiment, a reference divider 103 supplies a divided reference signal (ref divided) to one input of multiplexer 301a. The reference frequency to be divided is supplied to the reference divider 103 by a reference source 101, which can be derived from an external source (e.g., FM or cellular signals) or more typically a crystal oscillator. The other input to multiplexer 301a (the VCO divided signal) is generated by the VCO divider 111. Multiplexer 301a may output the VCO divided or ref divided signals at either outputs to the phase comparator 105. The true outputs of multiplexer 301a is dictated by mux 301b and switch 303. The operation of the phase comparator 105 and the current sources 107a, 107b remain transparent to the swapping of the phase comparator input signals. The outputs of current sources 107a, 107b are swapped by multiplexer 301b in conjunction with switch 303.

The operation of the circuit otherwise remains unchanged. That is, the charge pump 107 provides a summed current from the two current sources 107a, 107b to a LPF 109. The LPF 109 receives the summed current, filters out the modulated noise, and supplies the proper voltage to the VCO 113 for adjusting the VCO frequency.

Figure 6:
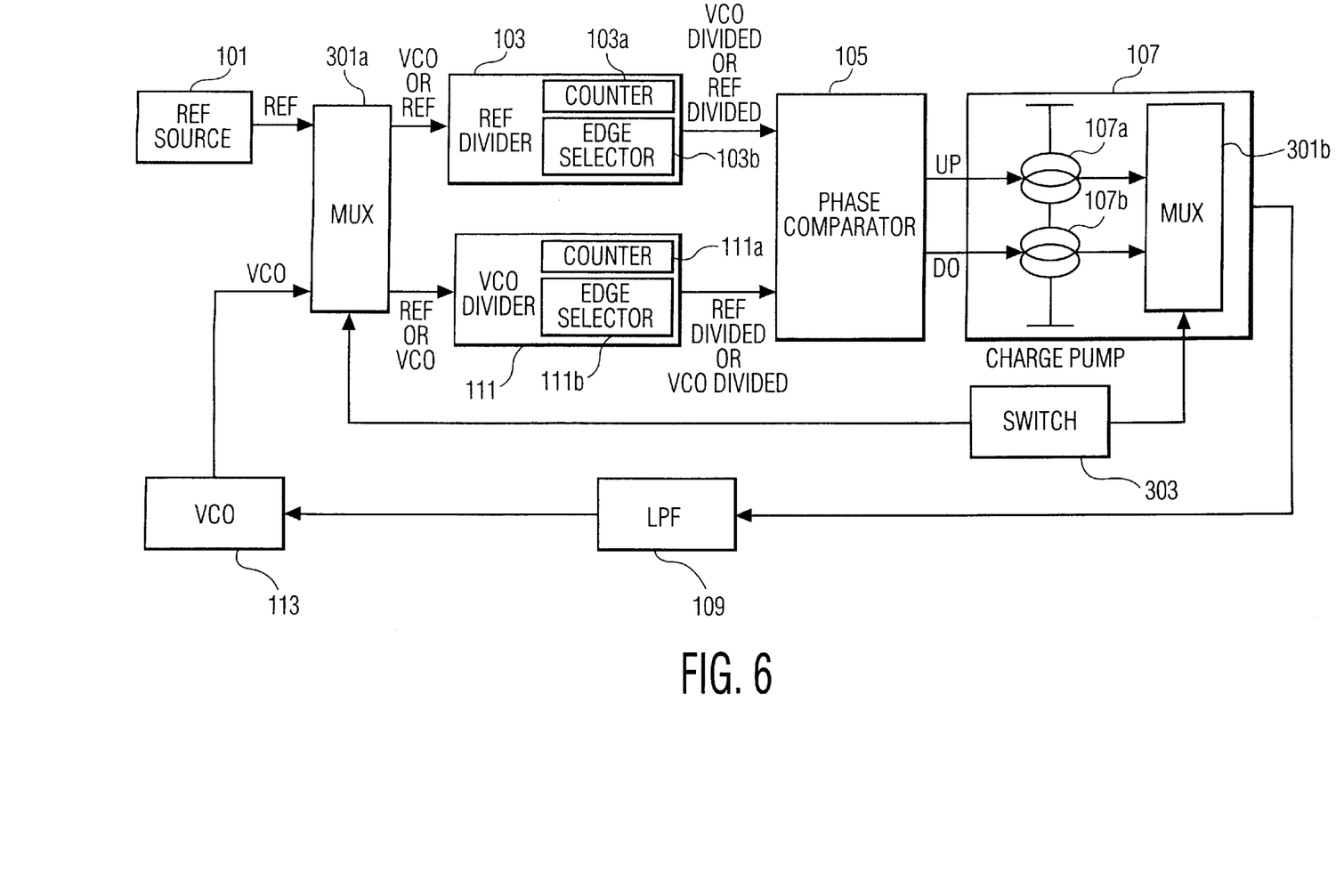
FIG. 6 is a diagram of an embodiment of the present invention, with chopper stabilization performed at the inputs of dividers and the output of a charge pump.

The multiplexers of the chopper stabilizer circuit can be configured to encompass an even larger number of PLL components. FIG. 6 illustrates placement of one of the multiplexers 301a immediately following the reference source 101 and the VCO 113. In this case, the reference source 101 outputs a reference signal received at one input of multiplexer 301a. Additionally, multiplexer 301a receives at its other input a VCO signal from VCO 113. As noted earlier, the outputs of the multiplexer 301a are governed by multiplexer 301b and switch 303. In this embodiment, symmetrical dividers are needed. The symmetry of the dividers (i.e., reference divider 103 and VCO divider 111) allows the dividers to be included within the chopper stabilizer circuit. One way to implement symmetrical dividers is to utilize a counter (e.g., 103a and 111a) and an edge detector (e.g., 103b and 111b) in each divider 103, 111. Only the edge selectors 103b, 111b are on the signal path (not shown) to the charge pump 107 and contribute to the noise in the system. These edge selectors 103b, 111b are swapped while the counters 103a, 111a are retained. This arrangement correctly maintains the division ratios and operating speeds of the dividers 103, 111. Thus, the counter associated with the VCO signal is maintained; likewise, the reference signal maintains coupling with its counter.

The two chopped signals from the dividers 103, 111 are then supplied to the phase comparator 105, which correspondingly generates the UP and DO signals to drive current sources 107a, 107b. As noted before, the UP and DO signals may be sent to any current source 107a or 107b, depending on the configuration of the mux 301b and the switch 303. The second multiplexer 301b is coupled to these current sources 107a, 107b and swaps their outputs. The corrected current outputs are then summed. Switch 303 controls the chopping rate of both multiplexers 301a, 301b. The output of the charge pump 107 is then filtered via the LPF 109, which eliminates the modulated noise.

Figure 7A:
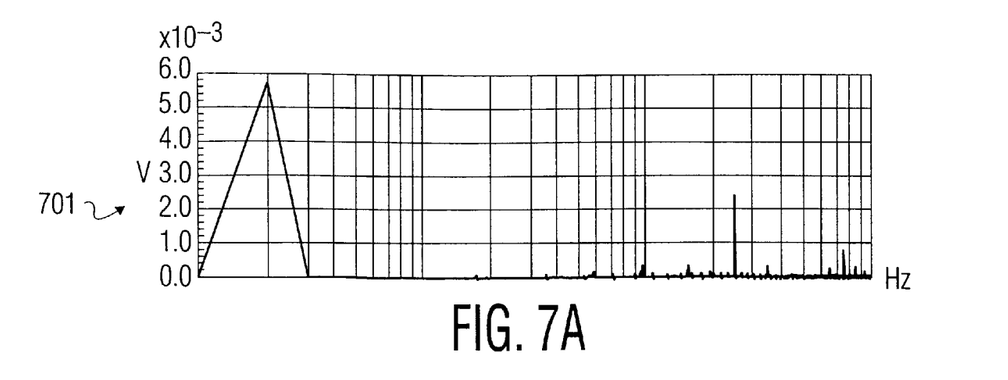
FIGS. 7a and 7b present charts illustrating the VCO spectrum with and without a chopper stabilizer circuit.
Figure 7B:
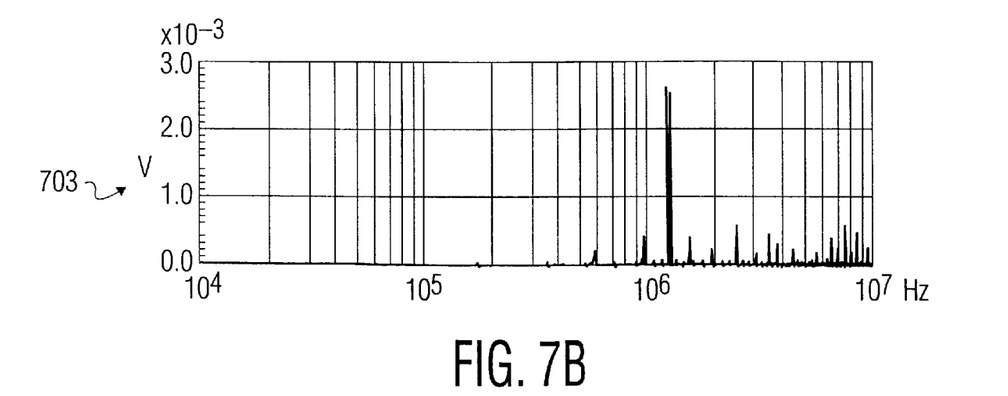

FIG. 7 presents the results of simulating the introduction of noise into a charge pump (as in FIG. 4) and the use of noise cancellation in accordance with the present invention. The graphs 701, 703 show a 20 kHz perturbation in the charge pump. Graph 701 illustrates the noise characteristics without chopper stabilization; in this case, the 20 kHz perturbation is quite evident. Once the switch is toggled (i.e., chopper stabilizer is turned on), the 20 kHz perturbation is modulated to approximately the chopping frequency (which is about 1.2 MHz) as shown in graph 703. The modulated noise can then be filtered out by a low-pass filter in the loop.

According to the present invention, the noise contribution from the charge pump can be effectively modulated to a high frequency for elimination by filtering through a LPF using a chopper stabilizer. The chopper stabilizer is implemented in the digital domain using a pair of multiplexers coupled to a switch. The switch swaps the input signals of each multiplexer at a relatively high chopping frequency. This implementation can be readily adapted to a number of PLL components that are symmetrical individually or symmetrical within a subsystem of components. In addition, in accordance with the preferred embodiment, nearly symmetrical charge pump circuits (e.g., single-ended charge pumps) as well as truly symmetrical charge pumps may benefit from this noise cancellation technique. By substantially reducing or eliminating the noise introduced by the charge pump, switching time of the PLL circuit is reduced because a larger bandwidth can be utilized.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A phase-locked loop circuit comprising:

a reference source that generates a reference signal;

a voltage controlled oscillator (VCO) that generates a VCO signal; and a phase comparator coupled to the reference source and the VCO, for detecting a phase error between the reference signal and the VCO signal, the phase comparator having an up-command output and a down-command output in response to the phase error;

a charge pump, for generating current to adjust phase alignment, the charge pump having a first input couplable to the up-command output when the second input is coupled to the down-command output and having the first input couplable to the down-command output when the second input is coupled to the up-command output;

a chopper stabilizer circuit for modulating noise by simultaneously decoupling the first input from the up-command output and the second input from the down-command output and coupling the first input to the down-command output and the second input to the up-command output, whereby the chopper stabilizer circuit has a first output for outputting one of an up-command signal and a down-command signal and a second output for outputting one of an up-command signal and down command signal; and a filter, coupled to an output of the charge pump, for filtering the modulated noise.

2. The phase-locked loop circuit as in claim 1, wherein the charge pump generates a first current in response to the up-command signal and a second current in response to the down-command signal, the chopper stabilizer circuit being coupled to the charge pump.

3. The phase-locked loop circuit as in claim 1, including a reference source that generates the first input signal and a voltage controlled oscillator (VCO) that generates the second input signal, wherein the filter receives the first and second currents from the charge pump, and outputs a voltage for controlling the frequency of the voltage controlled oscillator.

4. A phase-locked loop circuit comprising:

a phase comparator for determining a phase error between a first input signal and a second input signal and for outputting a first output signal and a second output signal in response to the phase error;

a charge pump, coupled to the phase comparator, for generating current to adjust phase alignment;

a chopper stabilizer circuit for modulating noise introduced in part by the charge pump, wherein the chopper stabilizer circuit is controlled to swap the first output signal and the second output signal at a chopping frequency higher than one half the frequency of the first input signal; and a filter for filtering the modulated noise.

5. A phase-locked loop circuit comprising:

a phase comparator for determining a phase error between a first input signal and a second input signal and for outputting a first output signal and a second output signal in response to the phase error;

a charge pump; for generating current to adjust phase alignment;

a chopper stabilizer circuit for modulating noise introduced in part by the charge pump, whereby the stabilizer chopper swaps the first output and the second output signals; and a filter for filtering the modulated noise, wherein the filter has a cut-off frequency of sufficient rate to eliminate the modulated noise.

6. A phase-locked loop circuit comprising:

a phase comparator for determining a phase error between a first input signal and a second input signal and for outputting a first output signal and a second output signal in response to the phase error;

a charge pump, coupled to the phase comparator, for generating current to adjust phase alignment, the charge pump outputting a first current that is proportional to the first output signal and a second current that is proportional to the second output signal;

a chopper stabilizer circuit for modulating noise introduced in part by the charge pump, wherein the stabilizer circuit comprises:

a first multiplexer that receives as inputs the first output signal and the second output signal and controllably swaps said inputs;

a second multiplexer that receives as inputs the first current and the second current and controllably swaps the first current and the second current; and a switch coupled to the first and second multiplexers to control the swapping by the first and second multiplexers; and a filter for filtering the modulated noise.

7. The phase-locked loop circuit as in claim 6, wherein the charge pump is a single-ended type charge pump comprising one output port, the second multiplexer comprising a first switching circuit and a second switching circuit, the first switching circuit being coupled to the switch and configured to receive the first output and second output signals, the second switching circuit being coupled to the switch and the one output port.

8. The phase-locked loop circuit as in claim 6, wherein the phase-locked loop circuit is a fractional-N type PLL.

9. A phase-locked loop circuit comprising:

a first source that generates a first input signal and a first frequency divider coupled to the first source for dividing the first input signal to produce a divided first input signal;

a second source that generates a second input signal and a second frequency divider coupled to the second source for dividing the second input signal to produce a divided second input signal;

a phase comparator coupled to the first source and the second source to detect a phase error between the first input signal and the second input signal and output a first output signal sand a second output signal in response to the phase error;

a charge sump for generating current to adjust phase alignment, the charge pump outputting a first current that is proportional to the first output signal and a second current that is proportional to the second output signal;

a chopper stabilizer circuit for modulating noise introduced in part by the charge pump, wherein the stabilizer circuit comprises:
a first multiplexer that receives as inputs the divided first input signal and the divided second input signal and controllably swaps said inputs;
a second multiplexer that receives as inputs the first current and the second current and controllably swaps the first current and the second current; and
a switch coupled to the first and second multiplexers to control the swapping by the first and second multiplexers; and
a filter for filtering the modulated noise.

10. The phase-locked loop circuit as in claim 9, wherein the charge pump is a single-ended type charge pump comprising one output port, the second multiplexer comprising a first switching circuit and a second switching circuit, the first switching circuit being coupled to the switch and configured to receive the first output and the second output signals, the second switching circuit being coupled to the switch and the one output port.

11. A phase-locked loop circuit comprising:
a phase comparator for determining a phase error between a first input signal and a second input signal and for outputting a first output signal and a second output signal in response to the phase error;
a charge pump, coupled to the phase comparator, for generating current to adjust chase alignment, the charge pump outputting a first current that is proportional to the first output signal and a second current that is proportional to the second output signal;
a chopper stabilizer circuit for modulating noise introduced in part by the charge pump, wherein the stabilizer circuit comprises:
a first multiplexer that receives as inputs the first input signal and the second input signal and controllably swaps said inputs;
a second multiplexer that receives as inputs the first current and the second current and controllably swaps the first current and the second current; and
a switch coupled to the first and second multiplexers to control the swapping by the first and second multiplexers; and
a filter for filtering the modulated noise.

12. The phase-locked loop circuit as in claim 11, wherein the charge pump is a single-ended type charge pump comprising one output port, the second multiplexer comprising a first switching circuit and a second switching circuit, the first switching circuit being coupled to the switch and configured to receive the first output and the second output signals, the second switching circuit being coupled to the switch and the one output port.

13. The circuit as in claim 11, wherein the PLL circuit is a fractional-N type PLL.

14. The circuit as in claim 11, wherein the first input signal is a reference signal and the second input signal is a VCO signal.

15. A method for canceling noise in a PLL circuit of a type having a reference source, a voltage controlled oscillator (VCO), a phase comparator, a charge pump, and a filter, comprising the stems of:
modulating the noise that is introduced in part by the charge pump by simultaneously swapping a plurality of input signals and a plurality of output signals associated with a chopper stabilizer circuit; and
filtering the modulated noise.

16. The method as in claim 15, further comprising:
generating a reference signal and a voltage controlled oscillator (VCO) signal;
detecting a phase error between the reference signal and the VCO signal;
generating an up-command signal and a down-command signal in response to the detecting step; and
supplying a first current to a low pass filer (LPF) in response to the up-command and a second current to the LPF in response to the down-command.

17. The method as in claim 16, wherein the step of modulating comprises:
receiving the up-command signal and the down-command signal as input signals into a first multiplexer;
swapping the input signals of the first multiplexer;
receiving the first current and the second current by a second multiplexer, the second multiplexer producing a plurality of output signals in response to said receiving step; and
swapping the output signals of the second multiplexer,
wherein the swapping of the input signals and the swapping of the output signals are performed simultaneously.

18. The method as in claim 17, wherein the supplying step is performed by the charge pump, the charge pump being of a single-ended type charge pump comprising one output port, the second multiplexer comprising a first switching circuit and a second switching circuit, the first switching circuit being coupled to the switch and configured to receive the down-command signal and the up-command signal, the second switching circuit being coupled to the switch and the one output port.

19. The method as in claim 16, further comprising:
generating a divided reference signal and a divided voltage controlled oscillator (VCO) signal;
receiving the divided reference signal and the divided VCO signal as input signals into a first multiplexer;
swapping the input signals of the first multiplexer;
receiving the first current and the second current by a second multiplexer, the second multiplexer producing a plurality of output signals in response to said receiving step; and
swapping the output signals of the second multiplexer,
wherein the swapping of the input signals and the swapping of the output signals are performed simultaneously.

20. The method as in claim 19, wherein the supplying step is performed by the charge pump, the charge pump being of a single-ended type charge pump comprising one output port, the second multiplexer comprising a first switching circuit and a second switching circuit, the first switching circuit being coupled to the switch and configured to receive the down-command signal and the up-command signal, the second switching circuit being coupled to the switch and the one output port.

21. The method as in claim 16, further comprising:

receiving the reference signal and the VCO signal as input signals into a first multiplexer;

swapping the input signals of the first multiplexer;

receiving the first current and the second current by a second multiplexer, the second multiplexer producing a plurality of output signals in response to said receiving step; and swapping the output signals of the second multiplexer, wherein the swapping of the input signals and the swapping of the output signals are performed simultaneously.

22. The method as in claim 21, wherein the supplying step is performed by the charge pump, the charge pump being of a single-ended type charge pump comprising one output port, the second multiplexer comprising a first switching circuit and a second switching circuit, the first switching circuit being coupled to the switch and configured to receive the down-command signal and the up-command signal, the second switching circuit being coupled to the switch and the one output port.

23. The method as in claim 15, wherein the filtering step is performed by a low pass filter (LPF) having a cut-off frequency that is of sufficient rate to eliminate the modulated noise.

24. A phase-locked loop circuit comprising:

a first source that generates a first signal and a first frequency divider coupled to the first source for dividing the first input signal to produce a divided first signal;

a second source: that generates a second input signal and a second frequency divider coupled to the second source for dividing the second input signal to produce a divided second signal;

a phase comparator for detecting a phase error between the first input signal and the second input signal, the phase comparator having a first input and a second input, the first input being couplable to the first frequency divider when the second input is coupled to the second frequency divider and having the first input couplable to the second frequency divider when the second input is coupled to the first frequency divider, the phase comparator further having a first phase comparator output for outputting one of an up-command signal and a down-command signal and a second phase comparator output for outputting one of an up-command signal and a down-command signal, the up-command signal and down-command signal being outputted in response to the phase error;

a charge pump for generating current to adjust phase alignment, the charge pump having a first input coupled to the first phase comparator output and having a second input coupled to the second phase comparator output;

a chopper stabilizer circuit for modulating noise by simultaneously decoupling the first input of the phase comparator from the first frequency divider and the second input of the phase comparator from the second frequency divider and coupling the first input of the phase comparator to the second frequency divider and the second input of the phase comparator to the first frequency divider, whereby the chopper stabilizer circuit includes a first output, coupled to the first input of the phase comparator, for outputting one of the divided first signal and the divided second signal, and a second output, coupled to the second input of the phase comparator, for outputting one of the divided first signal and the divided second signal; and a filter, coupled to an output of the charge pump, for filtering the modulated noise.

25. A phase-locked loop circuit comprising:

a first source that generates a first signal and a second source that generates a second signal;

a first frequency divider couplable to the first source for dividing the first signal to produce a divided first signal and a second frequency divider couplable to the second source for dividing the second signal to produce a divided second signal;

a phase comparator having a first input coupled to the first frequency divider and a second input coupled to the second frequency divider, for detecting a phase error between the first signal and the second signal, the phase comparator further having a first phase comparator output for outputting a first output signal and a second phase comparator output for outputting a second output signal, the first output signal and the second output signal being outputted in response to the phase error;

a charge pump for generating current to adjust phase alignment, the charge pump having a first input coupled to the first phase comparator output and having a second input coupled to the second phase comparator output;

a chopper stabilizer circuit for modulating noise by simultaneously decoupling the first frequency divider from the first source and the second frequency divider from the second source and thereafter coupling first frequency divider to the second source and the second frequency divider to the first source; and a filter, coupled to an output of the charge pump, for filtering the modulated noise.

* * * * *